United States Patent
Ibaraki et al.

(10) Patent No.: US 8,111,085 B2
(45) Date of Patent: Feb. 7, 2012

(54) SEMICONDUCTOR INTEGRATED CIRCUIT, SEMICONDUCTOR STORAGE DEVICE AND IMPEDANCE ADJUSTMENT METHOD

(75) Inventors: Takayuki Ibaraki, Kanagawa (JP); Shinya Tashiro, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/846,333

(22) Filed: Jul. 29, 2010

(65) Prior Publication Data

US 2011/0037496 A1     Feb. 17, 2011

(30) Foreign Application Priority Data

Aug. 11, 2009   (JP) ................................. 2009-186336

(51) Int. Cl.
    *H03K 19/003*      (2006.01)
(52) U.S. Cl. ........................................... 326/30; 326/26

(58) Field of Classification Search ..................... 326/21, 326/26, 30, 31
See application file for complete search history.

(56) References Cited

U.S. PATENT DOCUMENTS

| | | | |
|---|---|---|---|
| 6,573,747 B2 * | 6/2003 | Radhakrishnan | 326/30 |
| 7,808,270 B2 * | 10/2010 | Fujisawa | 326/30 |
| 7,902,858 B2 * | 3/2011 | Kuwahara et al. | 326/30 |
| 2008/0106301 A1 | 5/2008 | Fukushi | |

FOREIGN PATENT DOCUMENTS

JP      2008-118382 A     5/2008

* cited by examiner

*Primary Examiner* — James H Cho
(74) *Attorney, Agent, or Firm* — Sughrue Mion, PLLC

(57) ABSTRACT

It is desired to reduce the current consumption of an autonomous impedance adjustment circuit. The semiconductor integrated circuit according to the present invention stops the change in the drive capability of a driver correspondingly to the output (count data) of a comparator which is sequentially outputted for changing the drive capability of a replica driver and an output driver.

14 Claims, 9 Drawing Sheets

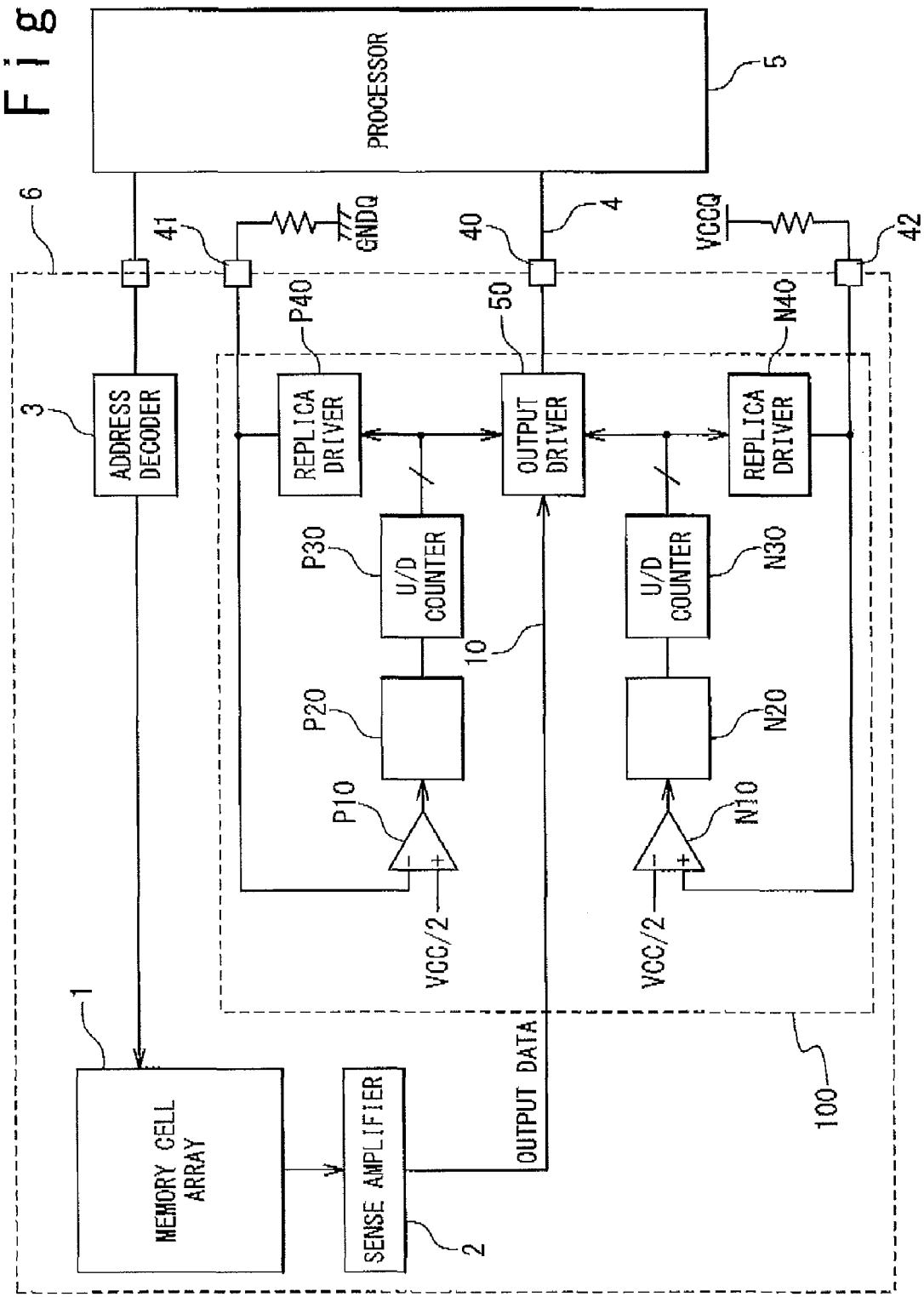

SEMICONDUCTOR INTEGRATED CIRCUIT, SEMICONDUCTOR STORAGE DEVICE AND IMPEDANCE ADJUSTMENT METHOD

INCORPORATION BY REFERENCE

This Patent Application is based on Japanese Patent Application No. 2009-186336. The disclosure of the Japanese Patent Application is incorporated herein by reference.

BACKGROUND OF THE INVENTION

1. Field of the Invention

The present invention relates to the impedance control of an output driver of a semiconductor integrated circuit, particularly to a semiconductor integrated circuit including an impedance matching circuit for autonomously performing output impedance adjustment and an impedance control method thereof.

2. Description of Related Art

With higher data transfer rate in data transfer between semiconductor devices and lower power consumption of the whole system that mounts a semiconductor integrated circuit thereon, demands and requirements for devices have been increased that can enhance impedance matching between an output driver and a transmission line as well as reduce the power consumption.

In the data transfer between semiconductor devices, when the output impedance of the output driver of the semiconductor integrated circuit is not matched to the impedance of the transmission line, reflection of a data signal outputted from the output driver occurs. In performing impedance matching, since a replica resistor likened to the impedance of the transmission line is used, the impedance of the transmission line is easy to change due to external factors such as the temperature. The output impedance of the semiconductor integrated circuit is easy to change due to an operating voltage in the circuit and temperature variation. Therefore, an impedance matching circuit for detecting change of the impedance and autonomously correcting the impedance has been provided.

Although the impedance matching circuit that can autonomously adjust the impedance has been used in the semiconductor integrated circuits such as the SRAM (Static Random Access Memory) that operate at high speed, they have not been used so much in the semiconductor integrated circuits such as the DRAM (Dynamic Random Access Memory) or the pseudo SRAM that require an operation with low power consumption. Accordingly, in most cases, reduction of power consumption of the impedance matching circuit itself has not been demanded. However, with higher data transfer rate in recent years, in order to prevent false transmission caused by reflection of the output data signal, impedance matching is being essential also in the DRAM and the pseudo SRAM. Furthermore, lower power consumption is being demanded in the semiconductor integrated circuits such as the SRAM that operate at high speed.

FIG. 1 is a diagram showing a configuration of a main part of a DRAM equipped with an autonomous impedance adjustment circuit according to a conventional technique.

Referring to FIG. 1, a DRAM according to the conventional technique includes a semiconductor integrated circuit 200 that outputs data outputted from a memory cell array to a processor. The semiconductor integrated circuit 200 is configured to autonomously adjust the output impedance and includes an output driver 50 that can change its current drive capability (current drivability) and an impedance matching circuit 60 having replica drivers P80, N80 that can change their current drive capability. Outputs of the replica drivers P80, N80 are coupled to corresponding replica resistors R71, R72, respectively. The impedance matching circuit 60 adjusts the current drive capability of the output driver 50 and the replica drivers P80, N80 based on output voltages of the replica drivers P80, N80 and a reference voltage. The semiconductor integrated circuit 200 is implemented in a single semiconductor package.

The impedance matching circuit 60 includes the replica drivers P80, N80, comparators P60, N60 and up/down (U/D) counters P70, N70. The replica driver P80 has the same configuration as that of a pull-up side circuit including a pull-up side transistor group of the output driver 50 and has the same output impedance as the pull-up side circuit. An output of the replica driver P80 is coupled to the replica resistor R71 having the same impedance as the characteristic impedance of a transmission line (data bus 51) coupled to the output driver 50. The comparator P60 compares an output voltage level of the replica driver P80 with a predetermined voltage level (VDDQ/2 in FIG. 1). The U/D counter P70 is a counter counting up or down according to a comparison result of the comparator P60. The current drive capability of the pull-up side circuit of the replica driver P80 and the output driver 50 is configured to change depending on the count value of the U/D counter P70. With the above-mentioned configuration, a value held in the U/D counter P70 converges, thereby achieving the impedance matching between the output of the replica driver P80 and the replica resistor R71.

In the impedance matching circuit 60, a structure for adjusting the output impedance of a pull-down side circuit of the output driver 50 is provided with components symmetrical to the components in the above-mentioned pull-up side circuit. The replica driver N80 has the same configuration as the pull-down side circuit including a pull-down side transistor group of the output driver 50 and the same output impedance as the pull-down side circuit. An output of the replica driver N80 is coupled to the replica resistor R72 having the same impedance as the characteristic impedance of the transmission line (data bus 51) coupled to the output driver 50. The comparator N60 compares the output voltage level of the replica driver N80 with a predetermined voltage level (VDDQ/2 in FIG. 1). The U/D counter N70 is a counter counting up or down according to a comparison result of the comparator N80. The current drive capability of the pull-down side circuit of the replica driver N80 and the output driver 50 is configured to change depending on the count value of the U/D counter N70. With the above-mentioned configuration, a value held in the U/D counter N70 converges, thereby achieving impedance matching between the output of the replica driver N80 and the replica resistor R72.

As described above, the current drive capability of the output driver 50 and the replica drivers P80, N80 is changed so as to match the impedances of the replica drivers P80, N80 to the impedances of the replica resistors N71, R72, respectively, in turn, match (automatically adjust) the output impedance of the output driver 50 to the impedance of the transmission line (data bus 51).

As an example of the autonomous output impedance adjustment circuit of conventional techniques, a semiconductor integrated circuit is described in Japanese Patent Application Publication JP 2008-118382 (referred to as Patent Literature 1). In the semiconductor integrated circuit described in Patent Literature 1, by adjusting the output impedance in synchronization with a clock signal generated in a semiconductor device such as a self-refresh timer, even when supply of an external clock is stopped, the operation of adjusting the output impedance can be stably continued.

SUMMARY

When a general impedance matching operation is performed in the semiconductor integrated circuit shown in FIG. 1, the size of the transistors driven in the output driver 50 and the replica drivers P80, N80 is changed at all times according to the comparison results of the comparators P60, N60. That is, even after the output impedance of the output driver 50 is matched to the impedance of the transmission line (data bus 51), the U/D counters P70, N70 are updated and the size of the transistors driven in the output driver 50 and the replica drivers P80, N80 is changed.

FIG. 2 is a timing chart showing an example of the impedance matching operation according to a conventional technique. Referring to FIG. 2, when the operation is started in a state where the output voltage of the replica driver P80 is lower than the reference voltage (VDDQ/2), the comparator P60 outputs a comparison result for count-up until the output voltage of the replica driver P80 exceeds the reference voltage (VDDQ/2) (a period during impedance matching).

After matching between the output impedance and the impedance of the transmission line, when the output voltage of the replica driver P80 exceeds the reference voltage (VDDQ/2), the comparator P60 outputs the comparison result for count-down and accordingly, the U/D counter P70 counts an U/D count set value down. Whereby, the sizes of the transistors driven in the output driver 50 and the replica driver P80 are changed and the output voltage returns to a previous state, that is, becomes lower than the reference voltage (VDDQ/2). As a result, the comparator P60 outputs the comparison result for count-up again according to a next clock signal CLK and sizes of the transistors driven in the output driver 50 and the replica driver P80 are changed. In this manner, even after impedance matching is achieved, at timings in synchronization with the internal clock CLK, sizes of the transistors driven in the output driver 50 and the replica driver P80 are changed. At this time, the plurality of parallely-connected transistors in the output driver 50 and the replica driver P80 are repeatedly turned on/off.

Such switching on/off of the transistors performed to change the drive capability of the output driver (to adjust the impedances) results in an increase in power consumption of the whole of the semiconductor device.

According to an aspect of the present invention, a semiconductor integrated circuit includes: an output driver having an output coupled to a transmission line and whose current drive capability is changed correspondingly to an impedance adjustment code; a replica driver having an output coupled to a replica resistor whose resistance is set to be K (K is a natural number) times of an impedance of the transmission line, and whose current drive capability is changed correspondingly to the impedance adjustment code; a comparator configured to output a comparison result of an output voltage of the output of the replica driver and a reference voltage as a count data; a counter configured to generate the impedance adjustment code based on a counting operation corresponding to the count data; and a counter control circuit configured to sequentially input the count data as a plurality of count data and to suspend the counting operation of the counter for a predetermined period of time correspondingly to the plurality of count data.

According to another aspect of the present invention, a semiconductor integrated circuit is coupled to a replica driver. The output impedance of the semiconductor integrated circuit is autonomously adjusted based on the replica resistor. The semiconductor integrated circuit comprising includes: an output driver having an output coupled to a transmission line; a replica driver having an output coupled to the replica resistor, each of the output driver and the replica driver having a current drive capability to be changed corresponding to an impedance adjustment code; a comparator coupled to the replica resistor to compare a terminal voltage of the replica resistor with a reference voltage and to output a comparison result thereof; a counter generating the impedance adjustment code based on a counting operation of the comparison result; and a counter control circuit coupled between the comparator and the counter to store a predetermined number of latest comparison results of the comparator and to suspend the counting operation based on the stored comparison results.

The semiconductor integrated circuit according to the present invention can preferably utilized as an output circuit for outputting the data read from a memory cell array in a semiconductor storage device to a processor.

As described above, according to the present invention, the change in the drive capability can be temporally stopped in accordance with a count data for changing the drive capability of a replica driver and an output driver. As a result, the current consumption in an impedance adjustment can be suppressed.

Further, since the change in drive capability is controlled in accordance with the sequentially inputted count data, so that even if the output impedance is changed caused by external circumstances, the impedance can be automatically adjusted by following the change.

Thus, according to the present invention, the power consumption of an autonomous impedance adjustment circuit can be reduced.

Further, the power consumption can be reduced without lowering impedance adjusting performance of the autonomous impedance adjustment circuit.

Furthermore, the power consumption of the autonomous impedance adjustment circuit can be suppressed without lowering tracking performance with respect to change of the impedance of a transmission line or an output impedance.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 9 is a diagram showing a configuration of a main part of a storage device according to the present invention.

DESCRIPTION OF THE PREFERRED EMBODIMENTS

Figure 1:
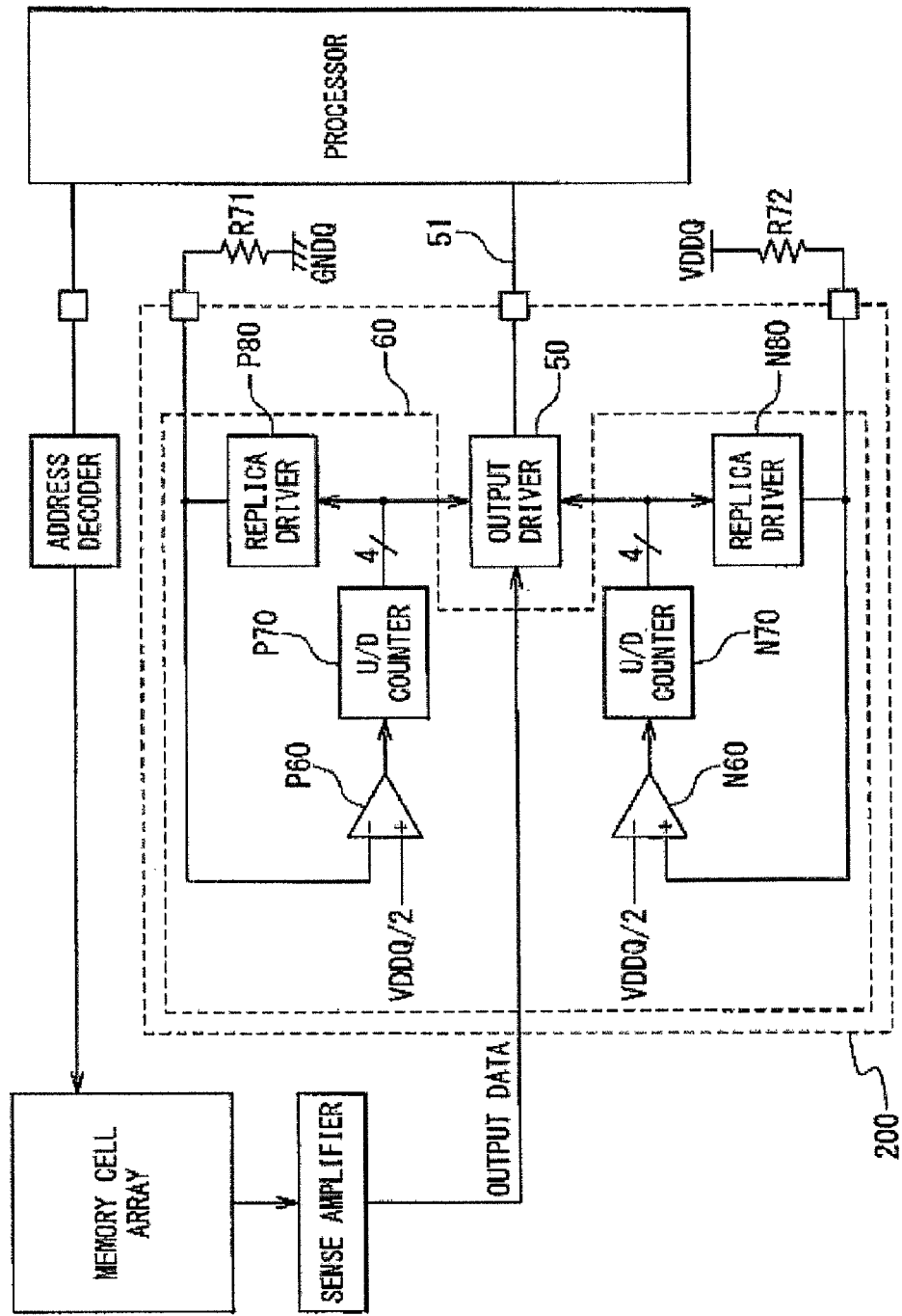
FIG. 1 is a diagram showing a configuration of a main part of a DRAM equipped with an autonomous impedance adjustment circuit according to a conventional technique.
Figure 2:
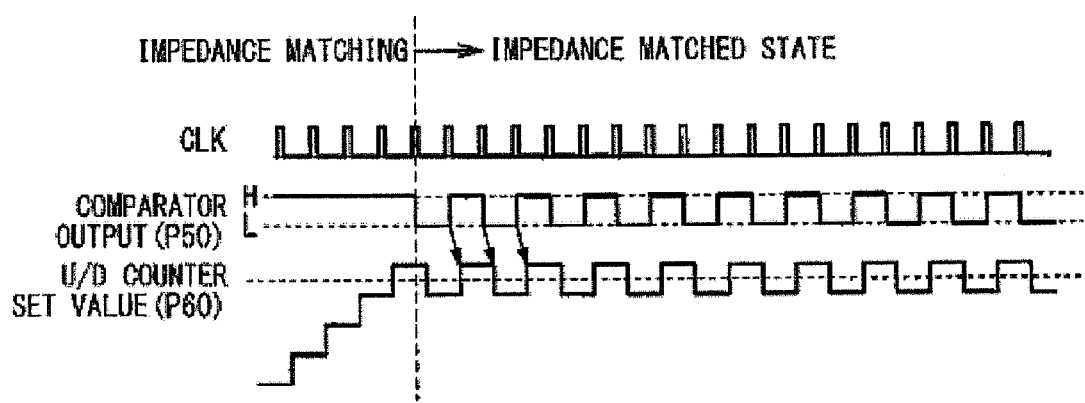
FIG. 2 is a timing chart showing an example of an impedance matching operation according to a conventional technique.

Some exemplary embodiments of the present invention will be described below referring to the accompanying drawings. In these drawings, the same or similar reference numerals denote the same, similar or equivalent components.

(Configuration)

Figure 3:
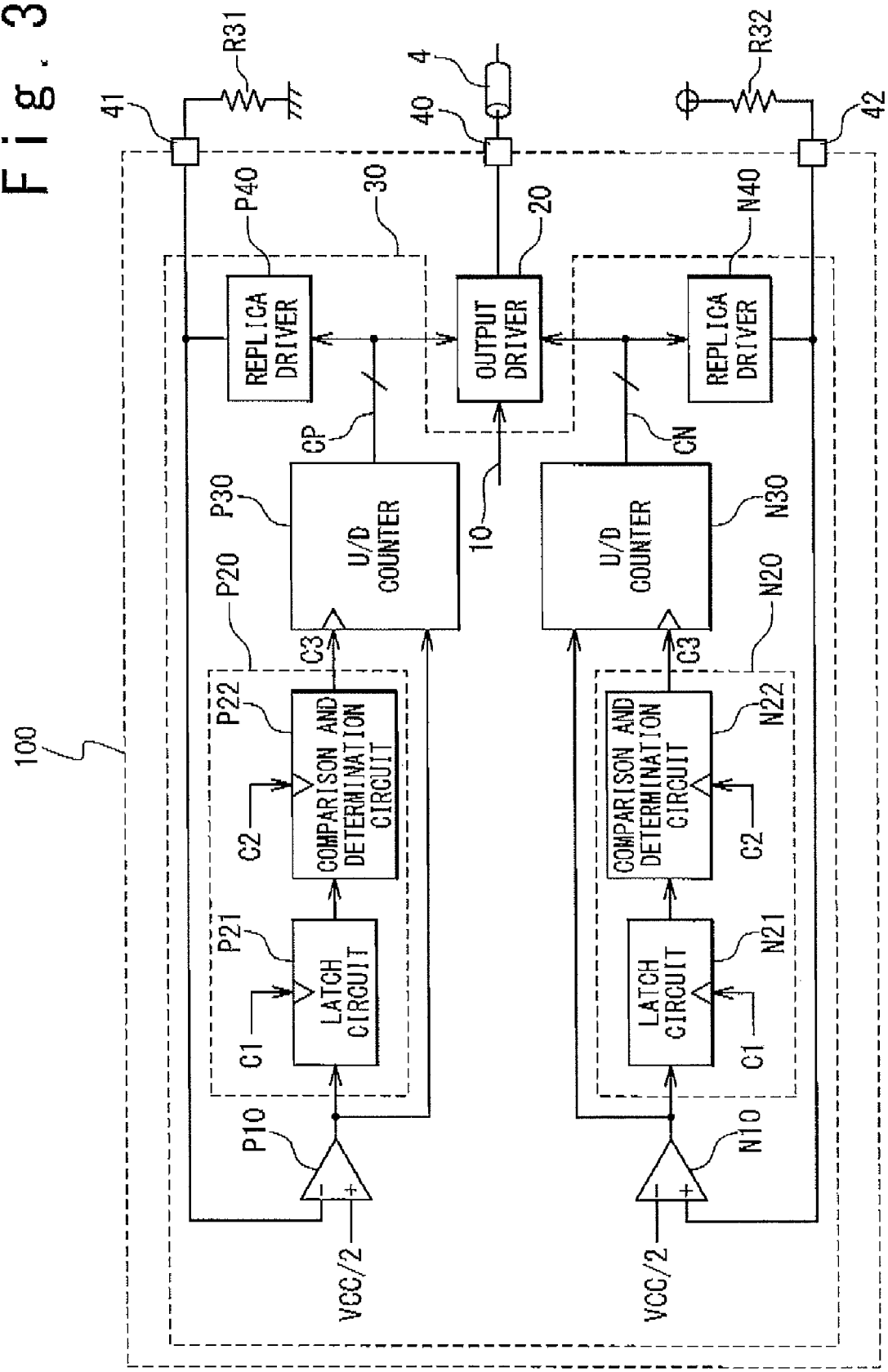
FIG. 3 is a diagram showing an example of configuration of a semiconductor integrated circuit including an autonomous impedance adjustment circuit according to the present invention.

Referring to FIG. 3, a configuration of a semiconductor integrated circuit 100 according to an embodiment of the present invention will be described. FIG. 3 is a diagram showing an example of the configuration of the semiconductor integrated circuit 100 including an autonomous impedance adjustment circuit according an embodiment of the present invention.

The semiconductor integrated circuit 100 according to the present embodiment includes an output driver 2 and an autonomous impedance adjustment circuit 30. The autonomous impedance adjustment circuit 30 includes comparators P10, N10, counter control circuits P20, N20, up/down (U/D) counters P30, N30 and replica drivers P40, N40.

The output driver 20 outputs output data 10 from a circuit not shown (for example, a memory cell array) to a transmission line 4 coupled to the output driver 20 (for example, a data bus) through an output terminal 40. Although detailed configuration will be described later, the output driver 20 includes a plurality of transistors and changes its current drive capability by selecting a transistor to be driven according to a signal inputted to each gate (impedance adjustment code). Whereby, the impedance of the output driver 20 can be matched to the impedance of the transmission line 4.

The replica driver P40 has the same configuration as a pull-up side circuit including a pull-up side transistor group of the output driver 20 and has the same output impedance as the pull-up side circuit. An output of the replica driver P40 is coupled to one end of a replica resistor R31, and the other end of which is grounded. The replica resistor R31 has the same impedance as the characteristic impendence of the transmission line 4 coupled to the output driver 20.

The comparator P10 compares an output voltage level of the replica driver P40 with a preset reference voltage level (VCC/2). A comparison result is inputted to the U/D counter P30 as a signal for count-up or count-down of the U/D counter P30 (hereinafter referred to as count data). For example, when the output voltage level of the replica driver P40 is lower than the reference voltage level (VCC/2), the count data for count-up (high level) is outputted, and when the output voltage level is higher than the reference voltage level (VCC/2), the count data for count-down (low level) is outputted. The count data is inputted to the counter control circuit P20.

The counter control circuit P20 controls an operation clock (clock signal C3) inputted to the U/D counter P30 according to the comparison result (count data) of the comparator P10. Describing in detail, the counter control circuit P20 includes a latch circuit P21 and a comparison and determination circuit P22. The latch circuit P21 latches an output of the comparator P10 in synchronization with a clock signal C1. Although details will be described later, simply explaining, the latch circuit P21 includes a plurality of registers (shift registers), successively latches the count data in synchronization with the clock signal C1 and holds the count data for a period corresponding to the number of registers. For example, when the registers of n stages are prepared, n pieces of count data outputted from the comparator P10 are latched during the period including successive n cycles. The comparison and determination circuit P22 compares the pieces of count data latched by the latch circuit P21 with each other in synchronization with a clock signal C2 and outputs the clock signal C3 corresponding to a comparison result to the U/D counter P30.

When the output impedance of the replica driver P40 is matched to the impedance of the replica resistor R31, the output of the replica driver P40 varies above and below with respect to the reference voltage (VCC/2). For this reason, when the value of the count data outputted from the comparator P10 is inverted from the value outputted last time, it is regarded that the output impedance is matched. The comparison and determination circuit P22 fetches the N pieces of count data latched by the latch circuit P21 in synchronization with the clock signal C2, compares data values (logical values) with each other and determines whether or not all data values coincide with each other. At this time, when inverted data having a different data value (logical value) is contained in the fetched N pieces of count data, the comparison and determination circuit P22 suspends the clock signal C3 to the U/D counter P30 (namely, blocks inputting of the clock signal C2 to the U/D counter P30). During this period, the U/D counter P30 suspends the counting operation. On the contrary, when all values of the fetched N pieces of count data coincide with each other, the comparison and determination circuit P22 outputs the clock signal C3 to the U/D counter P30 through the clock signal C2. During this period, the U/D counter P30 performs the counting operation in synchronization with the clock signal C3 (namely, in synchronization with the clock signal C2).

The U/D counter P30 generates an impedance adjustment code CP according to the count data outputted from the comparator P10. Describing in detail, the U/D counter P30 fetches the count data from the comparator P10 in synchronization with the clock signal C3 inputted from the counter control circuit P20 and counts up or counts down the impedance adjustment code of the predetermined number of bits by the counting operation corresponding to the count data. The count value in the U/D counter P30 is inputted to the replica driver P40 and the output driver 20 as the impedance adjustment code CP.

The current drive capability of the pull-up side circuit of the replica driver P40 and the output driver 20 varies depending on the impedance adjustment code CP inputted from the U/D counter P30. In other words, the output impedances of the replica driver P40 and the output driver 20 are adjusted by feeding back the output voltage of the replica driver P40 to the impedance adjustment code CP. Then, the impedance adjustment code CP converges, thereby achieving matching between the output impedance of the replica driver P40 and the impedance of the replica resistor R31. As a result, the current drive capability of a pull-up side circuit of the output driver 20 is adjusted.

Meanwhile, in order to adjust the current drive capability of a pull-down side circuit of the output driver 20, the components (the comparator N10, the counter control circuit N20, the up/down (U/D) counter N30 and the replica driver N40) which are symmetrical to the components of the pull-up side are provided on the pull-down side of the semiconductor integrated circuit 100.

The replica driver N40 has the same configuration as the pull-down side circuit including the pull-down side transistor group of the output driver 20 and has the same output impedance as the pull-down side circuit. An output of the replica driver N40 is coupled to one end (terminal 42) of the replica resistor R32, the other end of which is coupled to a power source VCC. The replica resistor R32 has the same impedance as the characteristic impedance of the transmission line 4 coupled to the output driver 20.

The comparator N10 compares an output voltage level of the replica driver N40 with the preset reference voltage level (VCC/2). The comparison result is inputted to the U/D counter N30 as count data for counting up or counting down the U/D counter N30. For example, when the output voltage level of the replica driver N40 is lower than the reference voltage level (VCC/2), the count data for count-up (high level) is outputted and when the output voltage level is higher than the reference voltage level (VCC/2), the count data for count-down (low level) is outputted. The count data is inputted to the counter control circuit N20.

The counter control circuit N20 controls the operation clock (clock signal C3) inputted to the U/D counter N30 according to the comparison result (count data) of the comparator N10. Describing in detail, the counter control circuit N20 includes a latch circuit N21 and a comparison and determination circuit N22. The latch circuit N21 latches an output of the comparator N10 in synchronization with the clock signal C1. At this time, the number of pieces of data latched is determined according to the number of registers mounted in the latch circuit N21. For example, when the registers of n stages are prepared, N pieces of count data outputted from the comparator N10 during a period including successive N cycles are latched. The comparison and determination circuit N22 compares the pieces of data latched by the latch circuit N21 with each other in synchronization with the clock signal C2 and outputs the clock signal C3 corresponding to its comparison result to the U/D counter N30.

When the output impedance of the replica driver N40 is matched to the impedance of the replica resistor R32, the output of the replica driver N40 varies above and below with respect to the reference voltage (VCC/2). For this reason, when the value of the count data outputted from the comparator N10 is inverted from the value outputted last time, it is regarded that the output impedance is matched. The comparison and determination circuit N22 fetches the N pieces of count data latched by the latch circuit N21 in synchronization with the clock signal C2, compares the data values with each other and determines whether or not all data values coincide with each other. At this time, when inverted data having a different data value is contained in the fetched N pieces of count data, the comparison and determination circuit N22 suspends the clock signal C3 to the U/D counter N30 (namely, blocks inputting of the clock signal C2 to the U/D counter N30). During this period, the U/D counter N30 suspends the counting operation. On the contrary, when all values of the fetched N pieces of count data coincide with each other, the comparison and determination circuit N22 outputs the clock signal C3 to the U/D counter N30 through the clock signal C2. During this period, the U/D counter N30 performs the counting operation in synchronization with the clock signal C3 (namely, in synchronization with the clock signal C2).

The U/D counter N30 counts up or counts down an impedance adjustment code CN according to the count data outputted from the comparator N10. Describing in detail, the U/D counter N30 fetches the count data from the comparator N10 in synchronization with the clock signal C3 inputted from the counter control circuit N20 and performs the counting operation corresponding to the count data. The count value in the U/D counter N30 is inputted to the replica driver N40 and the output driver 20 as the impedance adjustment code CN.

The current drive capability of the pull-down side circuit of the replica driver N40 and the output driver 20 varies depending on the impedance adjustment code CN inputted from the U/D counter N30. In other words, the output impedances of the replica driver N40 and the output driver 20 are adjusted by feeding back the output voltage of the replica driver N40 to the impedance adjustment code CN. Then, the impedance adjustment code CN converges, thereby achieving matching between the output impedance of the replica driver N40 and the impedance of the replica resistor R32. As a result, the current drive capability of the pull-down side circuit of the output driver 20 is adjusted.

As described above, by adjusting the current drive capability of the replica drivers P40, N40 based on the replica resistors R31, R32, it is possible to adjust the drive capability of the pull-up side circuit and the pull-down side circuit of the output driver 20 as well as to adjust the output impedance of the output driver 20 so as to be matched to the impedance of the transmission line 4.

According to the present embodiment, by controlling operations of the U/D counters P30, N30 by means of the counter control circuits P20, N20, the number of times the transistors driven in the replica drivers P40, N40 and the output driver 20 (drive capability) are changed can be reduced. In particular, by increasing the interval between the counting operations of the U/D counters P30, N30 only in the period when the output impedance is matched to the impedance of the transmission line 4, power consumption during a period when the impedances are matched can be reduced. Since impedance adjustment is automatically performed at normal timing when impedance matching is not achieved or the output impedance varies due to external environment (for example, temperature or voltage), adjustment can be achieved by tracking the change of the output impedance.

Figure 4:
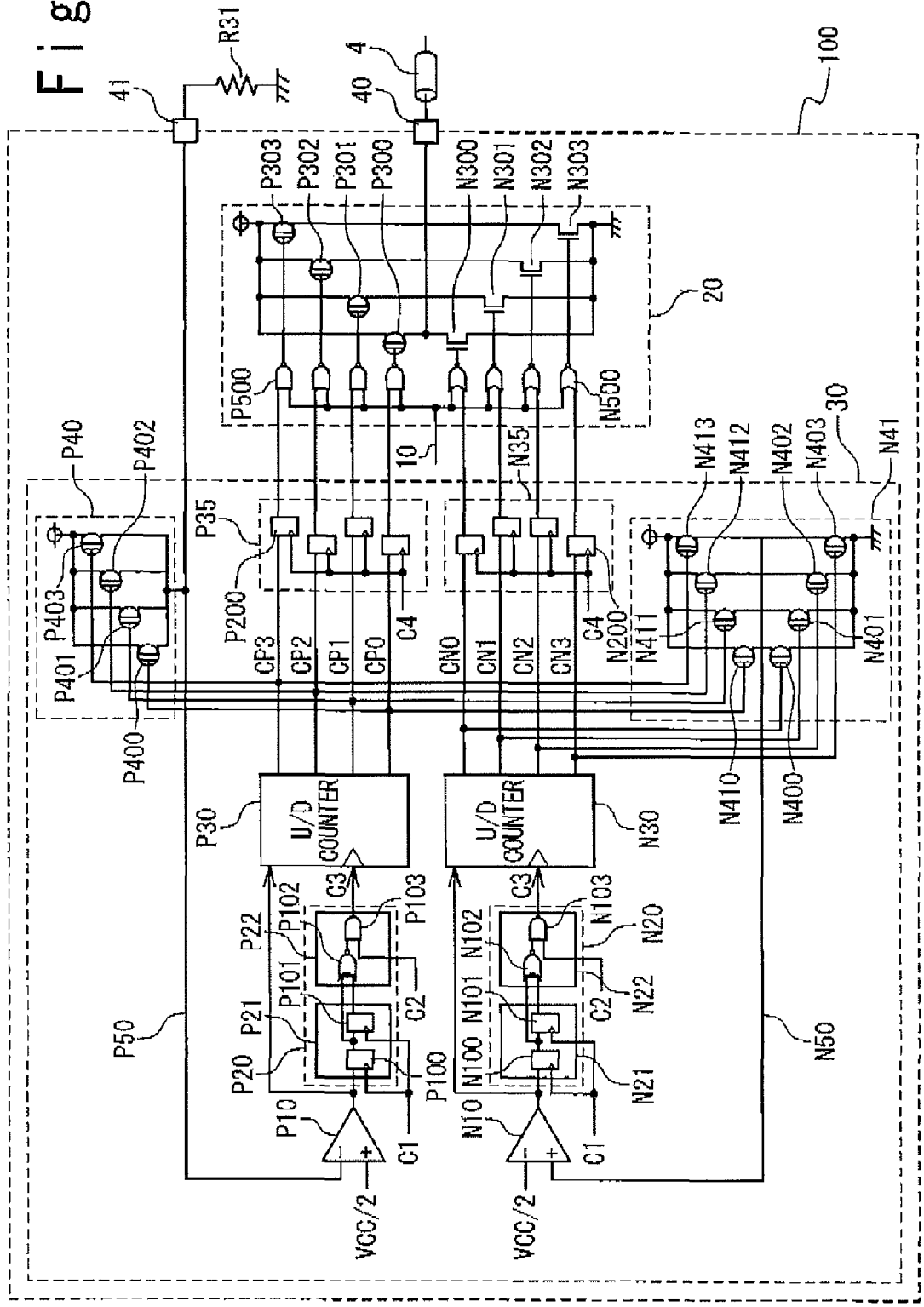
FIG. 4 is a diagram showing an example of configuration of the semiconductor integrated circuit including the autonomous impedance adjustment circuit according to the present invention.

FIG. 4 is a diagram showing an example of a configuration of the semiconductor integrated circuit 100 including the autonomous impedance adjustment circuit according to the present embodiment. Referring to FIG. 4, the configuration of the semiconductor integrated circuit 100 according to the present embodiment will be described in detail. In this example, each of the latch circuits P21, N21 includes registers of two stages and when a comparator output (count data) in a previous period and a current comparator output (count data) have different values (logical values), stops inputting of the clock signal C3. The replica driver P40 on the pull-up side is symmetrical to the replica driver N40 on the pull-down side in configuration. For this reason, in the example shown in FIG. 4, in place of the replica driver N40 on the pull-down side in FIG. 3, a replica driver N41 including a transistor group having the same configuration as the transistor group of the output driver 20 is provided.

The semiconductor integrated circuit 100 shown in FIG. 4 includes the output driver 20 and the autonomous impedance adjustment circuit 30. The autonomous impedance adjustment circuit 30 includes the comparators P10, N10, the counter control circuits P20, N20, the up/down (U/D) counters P30, N30, count value holding circuits P35, N35 (hereinafter referred to as register groups P35, N35) and the replica drivers P40, N41.

The output driver 20 outputs the output data 10 from a circuit not shown (for example, a memory cell array) to the transmission line 4 (for example, a data bus connected to a CPU) through the output terminal 40. The output driver 20 includes a pull-up side transistor group (PMOS transistors P300 to P303) and a pull-down side transistor group (NMOS transistors N300 to N303). The current drive capability of the output driver 20 is changed by changing the driven transistor. Describing in detail, the PMOS transistors P300 to P303 between respective sources and drains thereof are connected in parallel between the power source VCC (first power source) and the output terminal 40 (transmission line 4). The PMOS transistors P300 to P303 control electrical connection between the power source VCC and the output terminal 40 according to the impedance adjustment codes CP0 to CP3 inputted to respective gates thereof. Similarly, NMOS transistors N300 to N303 between respective sources and drains thereof are connected in parallel between the GND (second power source) and the output terminal 40 (transmission line 4). The NMOS transistors N300 to N303 control electrical connection between the GND and the output terminal 40 according to the impedance adjustment codes CN0 to CN3 inputted to respective gates thereof. Since the transistor of the output driver to be driven is selected according to 4-bits of data (impedance adjustment code CP) in this example, the number of transistors of each of the pull-up side circuit and the pull-down side circuit is four. However, the number of transistors is not limited to four.

The output driver 20 includes a plurality of NAND elements P500 that output NANDs of the output data 10 and count values CP0 to CP3 (hereinafter referred to as impedance adjustment codes CP0 to CP3) from the U/D counter P30 to the gates of the corresponding PMOS transistors P300 to P303. The output driver 20 includes a plurality of NOR circuits N500 that output NORs of the output data 10 and count values from the U/D counter N30 (hereinafter referred to as impedance adjustment codes CN0 to CN3) to the gates of the corresponding NMOS transistors N300 to N303.

First, an example of configurations of the comparator P10, the counter control circuit P20, the up/down (U/D) counter P30, the register group P35 and the replica driver P40 will be described.

The replica driver P40 includes PMOS transistors P400 to P403 having the same size and characteristics as the pull-up side transistor group (PMOS transistors P300 to P303) of the output drivers 20. The output of the replica driver P40 is coupled to one end of the replica resistor R31, the other end of which is coupled to the ground (an external terminal 41), and an input of the comparator P10. Describing in detail, the PMOS transistors P400 to P403 between respective sources and drains thereof are connected in parallel between the power source VCC, the external terminal 41 (the replica resistor R31) and an input P50 of the comparator P10. The PMOS transistors P400 to P403 control electrical connection between the power source VCC, the replica resistor R31 and the input P50 of the comparator according to the impedance adjustment codes CP0 to CP3 inputted to gates thereof.

Here, the output of the replica driver P40 is inputted to an inverting input terminal of the comparator P10 and the reference voltage (VCC/2) is inputted to a non-inverting input terminal of the comparator P10. The comparator P10 compares the output voltage level of the replica driver P40 and the preset reference voltage level (VCC/2) and outputs its comparison result to the latch circuit P21 and the U/D counter P30 as count data.

The latch circuit P21 shown in FIG. 4 includes two registers P100, P101 and latches the comparison result (count data) of the comparator P10 in synchronization with the clock signal C1. Describing in detail, in synchronization with the clock signal C1, the register P100 latches the count data of the comparator P10 as well as outputs the held count data to the register P101 and the comparison and determination circuit P22. The register P101 latches the count data inputted from the register P100 in synchronization with the clock signal C1, and outputs the held count data to the comparison and determination circuit P22. Whereby, the current count data outputted from the comparator P10 and the count data outputted at the previous clock are inputted to the comparison and determination circuit P22.

The comparison and determination circuit P22 shown in FIG. 4 is a matching detecting circuit including an EXNOR circuit P102 and an AND circuit P103. The EXNOR circuit P102 outputs an exclusive NOR of the count data outputted from the registers P100, P101 to the AND circuit P103. The AND circuit P103 outputs an AND of the clock signal C2 and an output of the EXNOR circuit P102 to the U/D counter P30 as the clock signal C3. That is, the AND circuit P103 outputs a matching detection result of the EXNOR circuit P102 in synchronization with the clock signal C2 as the clock signal C3.

In this example, the U/D counter P30 is a 4-bits counter. The U/D counter P30 fetches the output (count data) of the comparator P10 in synchronization with the clock signal C3 and accordingly, controls increase/decrease in the impedance adjustment code. For example, the U/D counter P30 counts up the count values (impedance adjustment codes CP0 to CP3) according to the count data of high level and counts down the count values according to the count data of low level. Here, the impedance adjustment code CP0 is defined as LSB and the impedance adjustment code CP3 is defined as MSB.

The impedance adjustment codes CP0 to CP3 are inputted to the register group P35 having a plurality of registers P200. The register group P35 has the registers P200 corresponding to the number of bits of the U/D counter P30 (here, four registers) and hold the impedance adjustment code CP0 to CP3 inputted thereto, respectively, in synchronization with a clock signal C4. The impedance adjustment codes CP0 to CP3 held in the register group P35 are inputted to the NAND circuits P500 of the output driver 20. Whereby, the impedance adjustment codes CP to CP3 inputted to the output driver 20 are updated at timing in synchronization with the clock signal C4.

Next, an example of configurations of the comparator N10, the counter control circuit N20, the up/down (U/D) counter N30, the register group N35 and the replica driver N41 will be described.

The replica driver N41 in this example includes PMOS transistors N410 to N413 and NMOS transistors N400 to N403 having the same size and characteristics as the pull-up side transistor group (PMOS transistors P300 to P303) and the pull-down side transistor group (NMOS transistors N300 to N303) of the output driver 20, respectively. PMOS transistors N410 to N413 between respective sources and drains thereof are connected in parallel between the power source VCC and an input N50 of the comparator N10. The PMOS transistors P410 to P413 control electrical connection between the power source VCC and the input N50 of the comparator N10 according to the impedance adjustment codes CP0 to CP3 inputted to gates thereof. The NMOS transistors N400 to N403 between respective sources and drains thereof are connected in parallel between the ground voltage GND and the input N50 of the comparator N10. The NMOS transistors N400 to N403 control electrical connection between the GND and the input N50 of the comparator N10 according to the impedance adjustment codes CN0 to CN3 inputted to gates thereof.

Here, an output of the replica driver N41 is inputted to a non-inverting input terminal of the comparator N10 and the reference voltage (VCC/2) is inputted to an inverting input terminal of the comparator N10. The comparator N10 compares the output voltage level of the replica driver N40 with the preset reference voltage level (VCC/2) and outputs its comparison result as count data to the latch circuit N21 and the U/D counter N30.

The latch circuit N21 shown in FIG. 4 includes two registers N100, N101 and latches the comparison result (count data) of the comparator N10 in synchronization with the clock signal C1. Describing in detail, in synchronization with the clock signal C1, the register N100 latches the count data of the comparator N10 as well as outputs the held count data to the register N101 and the comparison and determination circuit N22. The register N101 latches the count data inputted from the register N100 in synchronization with the clock signal C1, as well as outputs the held count data to the comparison and determination circuit N22. Whereby, the current count data outputted from the comparator N10 and the count data outputted at the previous cycle are inputted to the comparison and determination circuit N22.

The comparison and determination circuit N22 shown in FIG. 4 is a matching detecting circuit including an EXNOR circuit N102 and an AND circuit N103. The EXNOR circuit N102 outputs an exclusive NOR of the count data outputted from the registers N100, N101 to the AND circuit N103. The AND circuit N103 outputs an AND of the clock signal C2 and an output of the EXNOR circuit N102 to the U/D counter N30 as the clock signal C3. That is, the AND circuit N103 outputs a matching detection result of the EXNOR circuit N102 in synchronization with the clock signal C2 as the clock signal C3.

In this example, the U/D counter N30 is a 4-bits counter. In synchronization with the clock signal C3, the U/D counter N30 fetches the output (count data) of the comparator N10 and accordingly, controls increase/decrease in the impedance adjustment code. For example, the U/D counter N30 counts up the count values (impedance adjustment codes CN0 to CN3) according to count data of high level and counts down the count values according to count data of low level. Here, the impedance adjustment code CN0 is defined as LSB and the impedance adjustment code CN3 is defined as MSB.

The impedance adjustment codes CN0 to CN3 are inputted to the register group N35 having a plurality of registers N200. The register group N35 includes the registers N200 corresponding to the number of bits of the U/D counter N30 (here, four registers) and holds the impedance adjustment codes CN0 to CN3 inputted to the registers N200 in synchronization with the clock signal C4. The impedance adjustment codes CN0 to CN3 held in the register group N35 are inputted to the NOR circuits N500 of the output driver 20. Whereby, the impedance adjustment codes CN to CN3 inputted to the output driver 20 are updated at timing in synchronization with the clock signal C4.

In this example, the number of the PMOS transistors of the pull-up side circuit in each of the output driver 20 and the replica drivers P40, N41 is four. Gate widths of the four transistors are designed to have a basic size (Wp), a two-fold size of the basic size (2 Wp), a four-fold size of the basic size (4 Wp) and an eight-fold size of the basic size (8 Wp). Here, it is set that gate widths of the PMOS transistors P300, P400, N410 each have the basic size (Wp), gate width of the PMOS transistors P301, P401, N411 each have two-fold size of the basic size (2 Wp), gate widths of the PMOS transistors P302, P402, N412 each have four-fold size of the basic size (4 Wp) and gate widths of the PMOS transistors P303, P403, N413 each have eight-fold size of the basic size (8 Wp).

In this case, given that MSB is CP3 and LSB is CP0 in the 4-bits of impedance adjustment codes CP0 to CP3, the impedance adjustment code CP0 is inputted to the PMOS transistors P400, N410, the impedance adjustment code CP1 is inputted to the PMOS transistors P401, N411, the impedance adjustment code CP2 is inputted to the PMOS transistors P402, N412 and the impedance adjustment code CP3 is inputted to the PMOS transistors P403, N413. A calculation result of the NAND circuit P500 that receives an input of the impedance adjustment code CP0 is inputted to the PMOS transistors P300, a calculation result of the NAND circuit P500 that receives an input of the impedance adjustment code CP1 is inputted to the PMOS transistor P301, a calculation result of the NAND circuit P500 that receives an input of the impedance adjustment code CP2 is inputted to the PMOS transistor P302, and a calculation result of the NAND circuit P500 that receives an input of the impedance adjustment code CP3 is inputted to the PMOS transistor P303.

Given that MSB is CN3 and LSB is CN0 in the 4 bits of impedance adjustment codes CN0 to CN3, the impedance adjustment code CN0 is inputted to the NMOS transistors N400, N410, the impedance adjustment code CN1 is inputted to the NMOS transistors N401, N411, the impedance adjustment code CN2 is inputted to the NMOS transistors N402, N412 and the impedance adjustment code CN3 is inputted to the NMOS transistors N403, N413. A calculation result of the NOR circuit N500 that receives an input of the impedance adjustment code CN0 is inputted to the NMOS transistor N300, a calculation result of the NOR circuit N500 that receives an input of the impedance adjustment code CN1 is inputted to the NMOS transistor N301, a calculation result of the NOR circuit N500 that receives an input of the impedance adjustment code CN2 is inputted to the NMOS transistor N302 and a calculation result of the NOR circuit N500 that receives an input of the impedance adjustment code CN3 is inputted to the NMOS transistor N303.

With such configuration, by rewriting the impedance adjustment codes CP0 to CP3, CN0 to CN3 so that the output impedance of the replica resistor R31 is matched to the output impedance of the replica driver P40, the transistor to be driven (turned on) is selected to change the current drive capability of the output driver 20. In this manner, the output impedance of the output driver 20 can be matched to the impedance of the transmission line 4.

A resistance value of the replica resistor R31 may be set to be k times (k is a natural number) as large as the impedance of the transmission line 4 coupled to the data output terminal 40 and the current drive capability of each of the replica drivers P40 and N40 may be 1/k times as large as the output driver 20. In this case, gate sizes of the transistors forming the replica drivers P40, N40 may be 1/k times as large as a gate size of the corresponding transistors of the output driver 20. With above configuration, a current value of the replica resistor can be reduced.

In the semiconductor integrated circuit 100 according to the present embodiment, when the output of the replica driver P40 that changes with change of the drive capability is higher than or lower than the reference voltage (VCC/2), it is determined that impedance matching is achieved. In other words, when the output (count data) of the comparator P10 is inverted from the previous value, it is determined that the output impedance is matched. Since the output level of the replica driver P40 is controlled so as to fluctuate across the reference voltage (VCC/2) after impedance matching, the U/D counter P30 repeats count-up and count-down. However, according to the present embodiment, a stop period for stopping the counting operation is provided between the count-up operation and the count-down operation.

A plurality of registers that successively store outputs (count data) of the comparators P10, N10 therein are provided in the latch circuits P21, N21. When all pieces of count data stored in all prepared registers coincide each other, the U/D counters P30, N30 perform the counting operation, and when the register that holds count data having a different value exists, the U/D counters P30, N30 stop the counting operation. For this reason, the length of the stop period for stopping the counting operation can be changed depending on the number of stages of the registers provided in the latch circuit P21.

Since the counting operation and the drive capability of the replica drivers P40, N40 and the output driver 20 are not changed in this stop period, power consumption at impedance matching can be reduced.

(Operations)

Figure 5A:
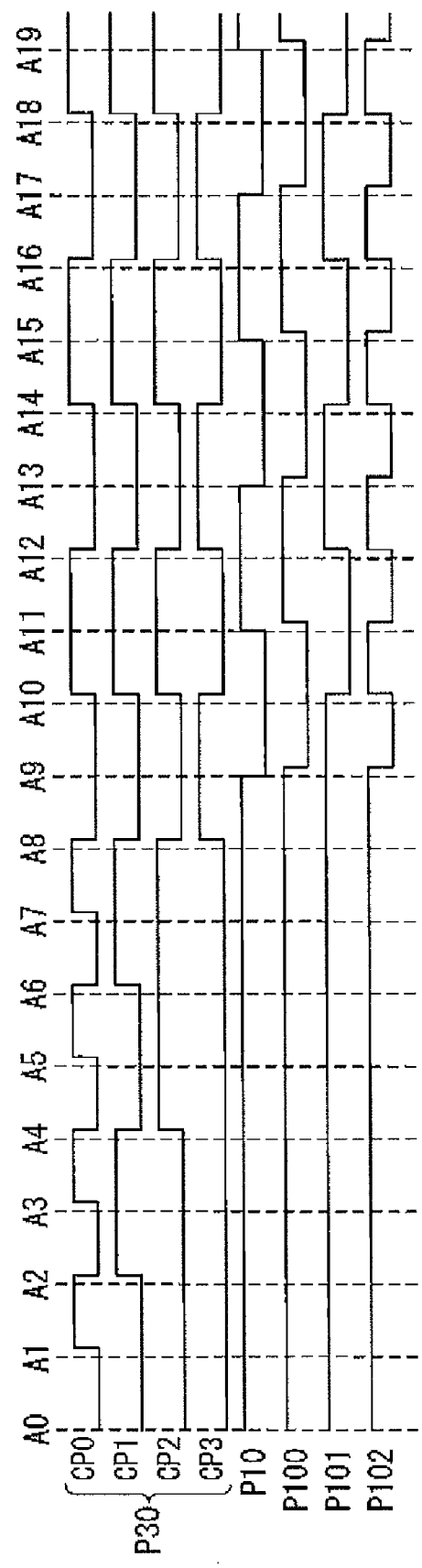
FIG. 5A is a timing chart showing an example of an impedance adjusting operation of a semiconductor integrated circuit according to the present invention.
Figure 5B:
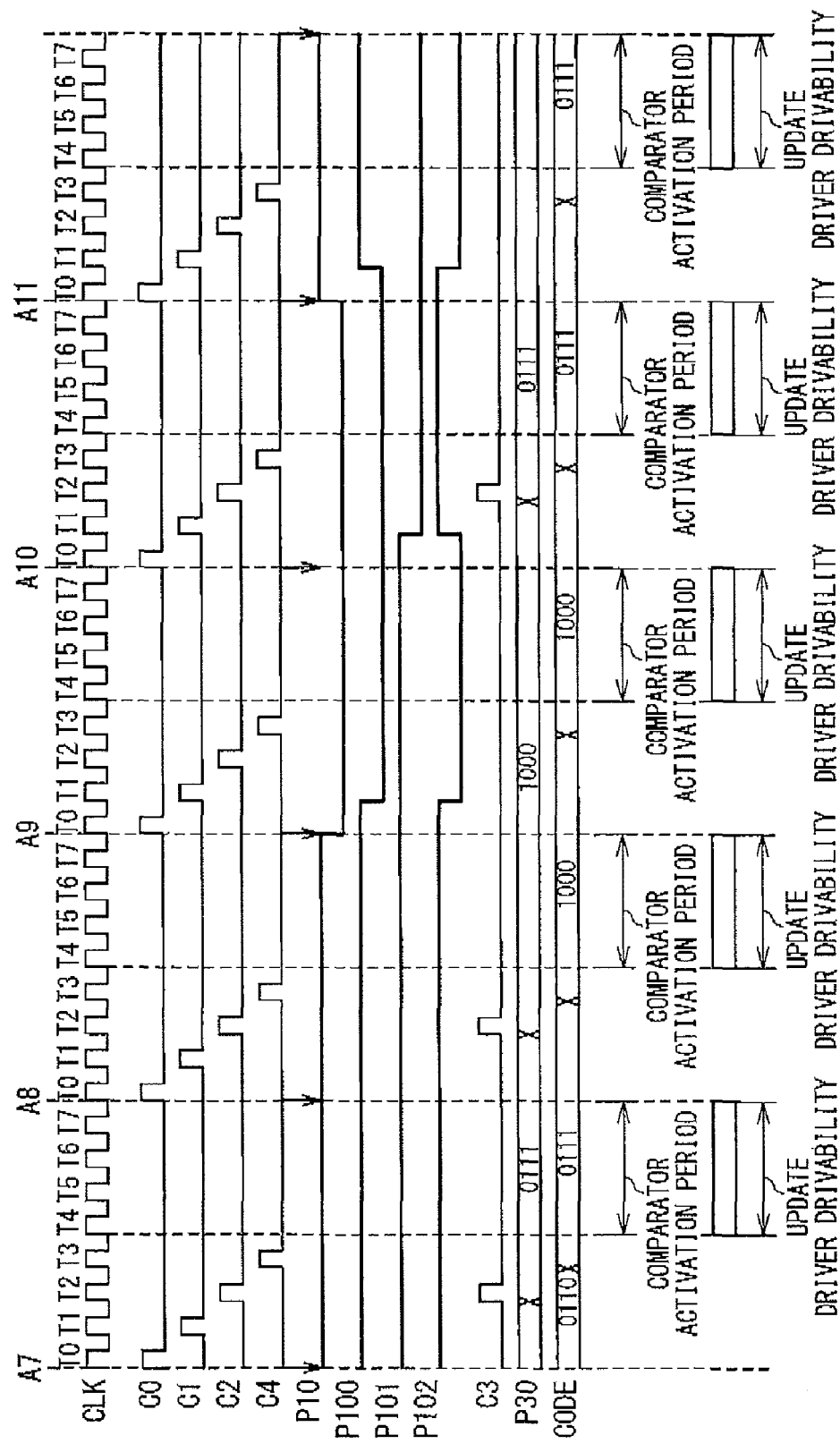
FIG. 5B is a timing chart showing details of a part of the impedance adjusting operation shown in FIG. 5B.

Next, referring to FIGS. 5A and 5B, operations of the semiconductor integrated circuit 100 shown in FIG. 4 will be described in detail. FIGS. 5A and 5B are timing charts showing an example of an impedance adjusting operation of the semiconductor integrated circuit 100 according to the present embodiment. Hereinafter, it is assumed that impedance matching is achieved in the state where the impedance adjustment codes CP0 to CP3 fall within the range between b'0111 and b'1000. Since operations relating to the impedance adjustment codes CN0 to CN3 for adjusting the drive capability of the pull-down side circuit are the same as those of the pull-up side circuit, description thereof is omitted.

First, summary of the operations will be described. The drive capability of the pull-up side circuit of the replica drivers P40, N40 and the output driver 20 is changed according to the impedance adjustment codes CP0 to CP3 set based on the output of the replica driver P40. Meanwhile, since the drive capability of the pull-up side transistors (PMOS transistors N410 to N413) of the replica driver N40 is determined according to the impedance adjustment codes CP0 to CP3 set by the replica driver P40, the impedance adjustment codes CN0 to CN3 set based on the output of the replica driver N40 change the drive capability of the pull-down side circuit of the replica driver N40 and the output driver 20. The output of the replica driver P40 is set based on the drive capability changed according to the impedance adjustment code CP and fed back to the setting of the impedance adjustment code CP. The output of the replica driver N40 is set based on the drive capability changed according to the impedance adjustment code CN and fed back to setting of the impedance adjustment code CN. By repeating such operations, the current drive capability of the output driver 20 is changed so that the output impedance is matched to the impedance of the transmission line 4.

According to the present embodiment, when positive/negative of a difference between the output of the replica driver P40 and a threshold is inverted, it is controlled so that the impedance adjustment code CP is maintained (does not change). Whereby, the operation of the counter P30 can be omitted and the operation of changing the drive capability of the replica drivers P40, N40 and the output driver 20 can be omitted, enabling reduction of power consumption accompanied by these operations.

Referring to FIGS. 5A and 5B, the U/D counter P30 performs the counting operation in synchronization with the clock signal C2 that becomes high level in only one cycle during eight cycles of an internal control clock CLK. It is assumed that the internal control clock CLK is a clock signal having eight cycles for controlling the semiconductor integrated circuit 100. Here, the internal control clock CLK is a clock signal that forms a pulse of a high level at each of times T0 to T7.

Here, a clock signal that controls timing for deciding the output of the comparator P10 (cycles A0 to A19) is defined as a clock signal C0. The clock signals C0 to C2, C4 are generated in synchronization with the internal control clock CLK. In this example, the clock signals C0 to C2, C4 each form a pulse of a high level at the times T0 to T2 and T3.

In the example shown in FIGS. 5A and 5B, the output impedance of the output driver 20 is matched by impedance adjustment at a cycle A7. Noting cycles A7 to A11, details of the impedance adjusting operation of the semiconductor integrated circuit 100 will be described below. Since impedance adjustment is performed at cycles A0 to A6 as at the cycle A7, description of operations at the cycles A0 to A6 is omitted.

Noting the cycle A7, the comparator P10 generates a control signal (count data) for count-up in synchronization with the clock signal C0 (cycle A7, time T0). The register P100 fetches the count data (high level) counted up in synchronization with the clock signal C1 from the comparator P10 (cycle A7, time T1). At this time, the register P101 fetches the count data (high level) held in the register P100 at a previous time (cycle A6).

Since both of the register P100 and the register P101 fetches the count data (high level) for count-up, the output of the EXNOR circuit P102 becomes high level and the AND circuit P103 is activated. Thus, the comparison and determination circuit P22 outputs the clock signal C3 to the U/D counter P30 through the clock signal C2 (cycle A7, time T2).

The U/D counter P30 counts up in synchronization with the clock signal C3 and the count value changes from b'0110 to b'0111 and the impedance adjustment codes CP0 to CP3 are changed (cycle A7, time T3).

The changed impedance adjustment codes CP0 to CP3 are fetched to the register group P35 in synchronization with the clock signal C4, thereby changing the drive capability on the pull-up side circuit of the output driver 20 (cycle A7, time T4). When the impedance adjustment codes CP0 to CP3 are b'0111, as the pull-up driving transistors of the output driver 20, the P-channel MOS transistor P300 having the basic size (Wp), the P-channel MOS transistor P301 having two-fold size of the basic size (2 Wp) and the P-channel MOS transistor P302 having four-fold size of the basic size (4 Wp) are selected, so that transistor size becomes seven-fold of the basic size (Wp) (cycle A7, time T4 to T7).

Meanwhile, when the impedance adjustment codes CP0 to CP3 are changed at the time T3, the drive capability of the replica driver P40 is changed. When the impedance adjustment codes CP0 to CP3 are b'0111, in the replica driver P40, the P-channel MOS transistor P400 having the basic size (Wp), the P channel MOS transistor P401 having two-fold size of the basic size (2 Wp) and the P-channel MOS transistor P402 having four-fold size of the basic size (4 Wp) are selected, so that transistor size becomes seven-fold of the basic size (Wp). Accordingly, the output voltage level of the replica driver P40 to the comparator P10 is changed (cycle A7, time T4 to time T7).

The comparator P10 compares the changed output voltage level of the replica driver P40 with the reference voltage (VCC/2) (cycle A7, time T4 to T7). In this example, when the impedance adjustment codes CP0 to CP3 are b'0111 (size of the drive transistors of the replica driver P40 is seven times as large as the basic size), the output voltage level of the replica driver P40 is lower than reference voltage (VCC/2). In this case, the comparison result (count data) of the comparator P10 becomes a high level.

As described, during the period from T4 to T7, the drive capability of the pull-up circuit of the replica driver P40, the output driver 20 and the replica driver N40 is updated and the comparator P10 is activated to update the count data. The activating time of the comparator P10 is not fixed and may be any time between the time T4 and the time T7 according to the performance of the comparator P10.

At the cycle A8, the comparator P10 generates count data (high level) for count-up in synchronization with the clock signal C0 (cycle A8, time T0). The register P100 fetches count data (high level) counted up in synchronization with the clock signal C1 from the comparator P10 (cycle A8, time T1). At this time, the register P101 fetches the count data (high level) held in the register P100 at the previous time (cycle A7).

Since both of the register P100 and the register P101 fetch the count data (high level) for count-up, the output of the EXNOR circuit P102 becomes a high level and the AND circuit P103 is activated. Whereby, the comparison and determination circuit P22 outputs the clock signal C3 to the U/D counter P30 through the clock signal C2 (cycle A8, time T2).

The U/D counter P30 counts up in synchronization with the clock signal C3 and the count value changes from b'0111 to b'1000, thereby changing the impedance adjustment codes CP0 to CP3 (cycle A8, time T3).

The changed impedance adjustment codes CP0 to CP3 are fetched to the register group P35 in synchronization with the clock signal C4, thereby changing the drive capability of the pull-up side circuit of the output driver 20 (cycle A8, time T4). When the impedance adjustment codes CP0 to CP3 are b'1000, as the pull-up side driving transistor of the output driver 20, only the P-channel MOS transistor P303 having eight-fold size of the basic size (8 Wp) is selected, so that the transistor size becomes eight-fold of the basic size (Wp) (cycle A8, time T4 to T7).

Meanwhile, when the impedance adjustment codes CP0 to CP3 are changed at the time T3, the drive capability of the replica driver P40 is changed. When the impedance adjustment codes CP0 to CP3 are b'1000, in the replica driver P40, only the P-channel MOS transistor P403 having eight-fold size of the basic size (8 Wp) is selected, so that the transistor size becomes eight-fold of the basic size (Wp). Accordingly, the output voltage level of the replica driver P40 to the comparator P10 is changed (cycle A8, time T4 to time T7).

The comparator P10 compares the changed output voltage level of the replica driver P40 with the reference voltage (VCC/2) (cycle A8, time T4 to T7). In this example, when the impedance adjustment codes CP0 to CP3 are b'1000 (size of the driving transistors of the replica driver P40 is eight-fold of the basic size), the output voltage level of the replica driver P40 is higher than the reference voltage (VCC/2). In this case, the comparison result (count data) of the comparator P10 becomes a low level.

Next, at the cycle A9, the comparator P10 generates count data (low level) for count-down in synchronization with the clock signal C0 (cycle A9, time T0). The register P100 fetches the count data (low level) for count-down in synchronization with the clock signal C1 from the comparator P10 (cycle A9, time T1). At this time, the register P101 fetches the count data (high level) held in the register P100 at the previous time (cycle A8).

Since the level (logical value) of the count data held in the register P100 is inverted from (do not coincide with one another) the level of the count data held in the register P101, the output of the EXNOR circuit P102 becomes a low level and the AND circuit P103 is deactivated. Whereby, the comparison and determination circuit P22 blocks the clock signal C2 and the clock signal C3 is kept to be a low level (cycle A9, time T2).

Since the clock signal C3 is not inputted, the U/D counter P30 does not perform the counting operation and does not update the impedance adjustment codes CP0 to CP3 (cycle A9, time T3).

Although the impedance adjustment codes CP0 to CP3 are fetched to the register group P35 in synchronization with the clock signal C4, since the impedance adjustment codes CP0 to CP3 do not change from the previous time (cycle A8), the drive capability of the pull-up side circuit of the output driver 20 is not changed (cycle A9, time T4). That is, a size of the pull-up driving transistor of the output driver 20 still remains to be eight-fold of the basic size (Wp) (cycle A9, time T4 to T7).

Meanwhile, since the impedance adjustment codes CP0 to CP3 are not changed at the time T3, the drive capability of the replica driver P40 is not changed. In other words, a size of the driving transistor of the replica driver P40 still remains to be eight-fold of the basic size (Wp) and the output voltage level of the replica driver P40 to the comparator P10 also keeps the same value as the value at the previous time (cycle A8) (cycle A9, time T4 to time T7).

The comparator P10 compares the output voltage level of the replica driver P40 with the reference voltage (VCC/2) (cycle A9, time T4 to T7). Here, since the output voltage level of the replica driver P40 does not change from the previous cycle A8, the output voltage is higher than the reference voltage (VCC). In this case, the comparison result (count data) of the comparator P10 becomes a low level as in the cycle A8.

At the cycle A10, the comparator P10 generates count data (low level) for count-down in synchronization with the clock signal C0 (cycle A10, time T0). The register P100 fetches the count data (low level) for count-down from the comparator P10 in synchronization with the clock signal C1 (cycle A10, time T1). At this time, the register P101 fetches the count data (low level) held in the register P100 at the previous time (cycle A9).

Since both of the register P100 and the register P101 fetch the count data (low level) for count-down, the output of the EXNOR circuit P102 becomes a high level and the AND circuit P103 is activated. Whereby, the comparison and determination circuit P22 outputs the clock signal C3 to the U/D counter P30 through the clock signal C2 (cycle A10, time T2).

The U/D counter P30 counts down in synchronization with the clock signal C3 and the count value changes from b'1000 to b'0111, thereby changing the impedance adjustment codes CP0 to CP3 (cycle A10, time T3).

The changed impedance adjustment codes CP0 to CP3 are fetched to the register group P35 in synchronization with the clock signal C4, thereby changing the drive capability of the pull-up side circuit of the output driver 20 (cycle A10, time T4). When the impedance adjustment codes CP0 to CP3 are b'0111, a size of the pull-up driving transistor of the output driver 20 becomes seven-fold of the basic size (Wp) (cycle A10, time T4 to T7).

Meanwhile, when the impedance adjustment codes CP0 to CP3 are changed at the time T3, the drive capability of the replica driver P40 is changed. When the impedance adjustment codes CP0 to CP3 are b'0111, a size of the replica driver P40 becomes seven-fold of the basic size (7 Wp). Accordingly, the output voltage level of the replica driver P40 to the comparator P10 is changed (cycle A10, time T4 to time T7).

The comparator P10 compares the changed output voltage level of the replica driver P40 with the reference voltage (VCC/2) (cycle A10, time T4 to T7). When the impedance adjustment codes CP0 to CP3 are b'0111 (a size of the driving transistor of the replica driver P40 is seven-fold of the basic size), the output voltage level of the replica driver P40 is lower than the reference voltage (VCC/2). In this case, the comparison result (count data) of the comparator P10 becomes a high level.

Next, at the cycle A11, the comparator P10 generates count data (high level) for count-up in synchronization with the clock signal C0 (cycle A11, time T0). The register P100 fetches the count data (high level) for count-up from the comparator P10 in synchronization with the clock signal C1 (cycle A11, time T1). At this time, the register P101 fetches the count data (low level) held in the register P100 at the previous time (cycle A10).

Since the level (logical value) of the count data held in the register P100 is inverted from (do not coincide with) the level of the count data held in the register P101, the output of the EXNOR circuit P102 becomes a low level and the AND circuit P103 is deactivated. Whereby, the comparison and determination circuit P22 blocks the clock signal C2 and the clock signal C3 is kept to be a low level (cycle A11, time T2).

Since the clock signal C3 is not inputted, the U/D counter P30 does not perform the counting operation and the impedance adjustment codes CP0 to CP3 are not updated (cycle A11, time T3).

Although the impedance adjustment codes CP0 to CP3 are fetched to the register group P35 in synchronization with the clock signal C4, since the impedance adjustment codes CP0 to CP3 do not change from the previous time (cycle A10), the drive capability of the pull-up side circuit of the output driver 20 is not changed (cycle A11, time T4). In other words, a size of the pull-up driving transistors of the output driver 20 still remains to be seven-fold of the basic size (Wp) (cycle A11, time T4 to T7).

Meanwhile, since the impedance adjustment codes CP0 to CP3 are not changed at the time T3, the drive capability of the replica driver P40 is not also changed. That is, sizes of the driving transistors of the replica driver P40 still remain to be seven-fold of the basic size (Wp) and the output voltage level of the replica driver P40 to the comparator P10 is kept to be the same value as that at the previous time (cycle A10) (cycle A11, time T4 to time T7).

The comparator P10 compares the output voltage level of the replica driver P40 with the reference voltage (VCC/2) (cycle A11, times T4 to T7). Here, since the output voltage level of the replica driver P40 does not change from the previous cycle A10, the output voltage level is lower than the reference voltage (VCC/2). In this case, the comparison result (count data) of the comparator P10 is a high level as at the cycle A10.

In the above-mentioned example, the U/D counter P30 counts up the impedance adjustment codes until the output voltage P50 of the replica driver P40 exceeds the reference voltage (VCC/2) (cycle A0 to A8) and when the output voltage P50 exceeds the reference voltage (VCC/2), stops the counting operation at the next cycle A9. Since registers of two stages P100, P101 are provided in the latch circuit P21, the stop period of the counting operation at impedance matching is one cycle (cycle A9). Since the output (count data) of the comparator P10 coincides with the count data outputted at the previous cycle A9, at the next cycle A10 subsequent to the stop period, impedance adjustment is performed again. However, since the count data is inverted again, the counting operation is stopped at the next cycle T11 and impedance adjustment is not performed. As described above, according to the present embodiment, after impedance matching, stable period (stable state) during which impedance adjustment (cycle A8, A10) and count stopping (impedance adjustment stopping: cycle A9, A11) are repeated starts. After that (cycle A12 to A19), operations as those at the cycle A8 to A11 are repeated to maintain the stable state.

Figure 6:
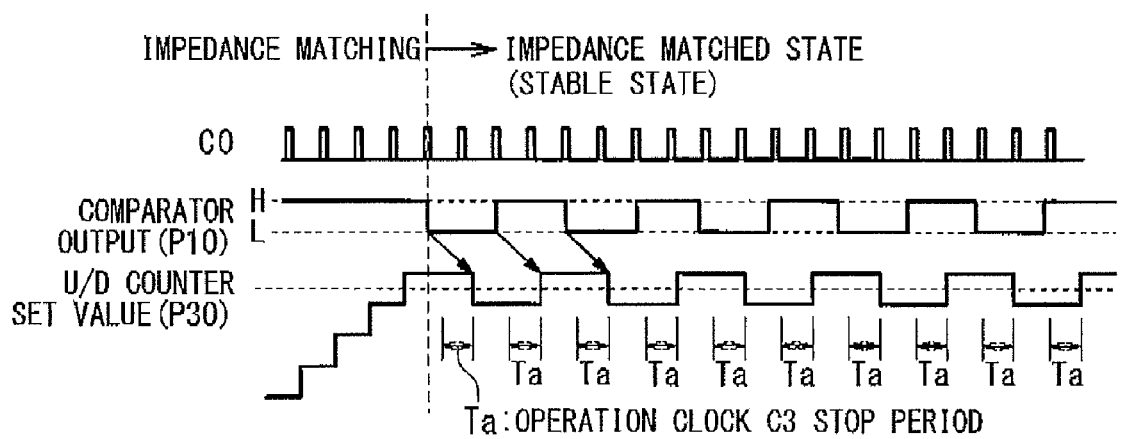
FIG. 6 is a timing chart showing an example timings during and after impedance matching in the impedance adjusting operation according to the present invention (the number of buffer stages is two)

FIG. 6 is a timing chart showing an example of timings before and after impedance matching in the impedance adjusting operation according to the present embodiment (the number of buffer stages is two). As shown in FIG. 6, the drive capability of the driver varies due to the counting operation before impedance matching, while the stable period (stable state) is maintained after impedance matching. At this time, when the registers of two stages are provided in the latch circuit P21, N21, the stop period Ta of the counting operation (drive capability changing operation) is one cycle.

In the stable period, the output impedance can vary depending on external environment and operating environment. However, even in this case, the state returns to the matching state by impedance adjustment through count-up shown at the cycle A8 (drive capability strengthening) or impedance adjustment by count-down shown at the cycle A10 (drive capability weakening) and automatically shifts to the stable period (stable state).

The components (the comparator N10, the counter control circuit N20, the up/down (U/D) counter N30 and the replica driver N40 or N41) for adjusting the drive capability of the pull-down side circuit (NMOS transistors N300 to N303) of the output driver 20 perform similar operations.

As described above, according to the present embodiment, the number of times the output impedance is adjusted after impedance matching is reduced than conventional. Thus, since the counting operation stops while the impedance adjustment code is fixed, power consumption is reduced. Furthermore, whether or not the clock signal C3 is inputted to the U/D counters P30, N30 is determined depending on the comparison results (count data) of the comparators P10, N10 that are outputted at the previous cycle. For this reason, when the replica resistor R31 changes due to external factors in the stable period and thus, the output P50 of the replica driver P40 changes, the counting operation corresponding to the change of the output P50 is performed at the next cycle. That is, according to the present embodiment, tracking performance of adjustment of the output impedance that changes due to external factors is improved.

In the example shown in FIGS. 5A and 5B, in the stable state, the counting operation is performed every two cycles. However, the number of cycle is not limited to this example. The stop period Ta during the stable period is changed depending on the number of registers (the number of stages) provided in the latch circuit P21.

Figure 7:
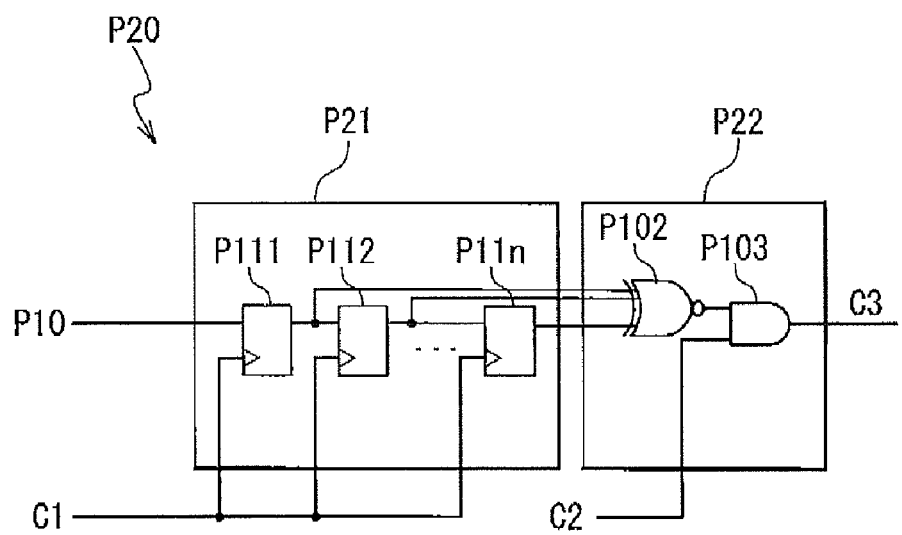
FIG. 7 is a diagram showing a configuration of a counter control circuit including registers of n+1 stages.

FIG. 7 is a diagram showing a configuration of the counter control circuit P20 including registers of n+1 stages. The latch circuit P21 shown in FIG. 7 includes n registers P111 to P11n and latches a comparison result (count data) of the comparator P10 in synchronization with the clock signal C1. Describing in detail, in synchronization with the clock signal C1, the register P111 latches the count data of the comparator P10 as well as outputs the held count data to the register P112 and the comparison and determination circuit P22 (the EXNOR circuit P102).

In synchronization with the clock signal C1, the registers P112 to 11n−1 each latch the count data inputted from the register of the previous stage as well as outputs the held count data to the register of the subsequent register and the comparison and determination circuit P22 (the EXNOR circuit P102). In synchronization with the clock signal C1, the register P11n latches the count data inputted from the register P11n–1 as well as outputs the held count data to the comparison and determination circuit P22 (the EXNOR circuit P102). Whereby, the count data for n clocks that is outputted from the comparator P10 is inputted to the comparison and determination circuit P22.

Referring to FIG. 7, the EXNOR circuit P102 outputs an exclusive NOR of the count data outputted from the registers P110 to 11n to the AND circuit P103. The AND circuit P103 outputs an AND of the clock signal C2 and the output of the EXNOR circuit P102 to the U/D counter P30 as the clock signal C3. That is, the AND circuit P103 outputs the matching detecting result of the EXNOR circuit P102 as the clock signal C3 in synchronization with the clock signal C2.

Figure 8:
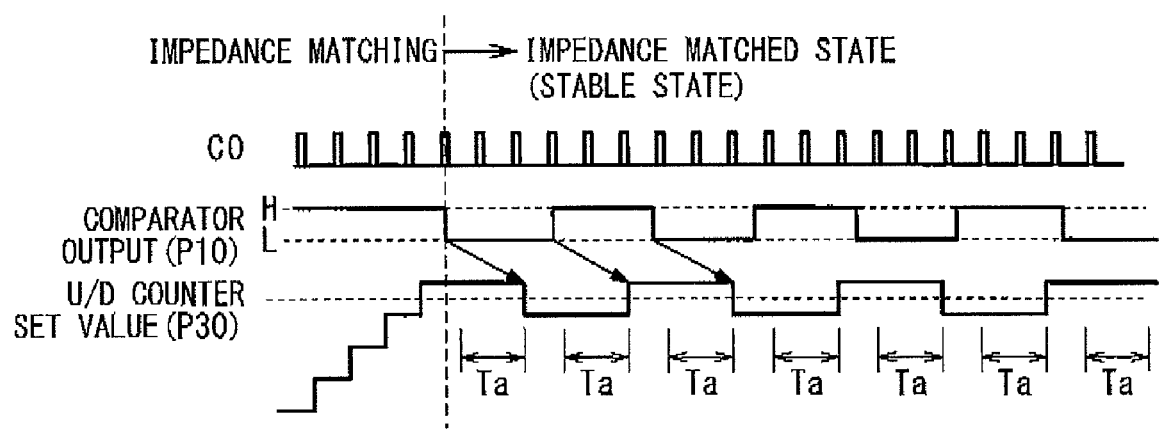
FIG. 8 is a timing chart showing another example timings during and after impedance matching in the impedance adjusting operation according to the present invention (the number of buffer stages is three)

With above configuration, the latch circuit P21 latches n pieces of count data outputted from the comparator P10 in a period including n successive cycles. The comparison and determination circuit P22 compares the count data latched by the latch circuit P21 in synchronization with the clock signal C2 and outputs the clock signal C3 corresponding to the comparison result to the U/D counter P30. The counter control circuit N20 has similar configuration and operations. In this case, the stop period Ta in the stable state is n–1 cycle and the counting operation (impedance adjustment) is performed every n cycles in the stable period. For example, when the number n of registers provided in the latch circuit P21 in FIG. 7 is three, as shown in FIG. 8, the stop period Ta in the stable state is two cycles and the counting operation is performed every three cycles.

As described above, since the stop period Ta in the stable state can be freely changed by changing the number of stages of the registers provided in the latch circuit P21, a reduced amount of power consumption can be set in consideration of the tracking performance to change of the output impedance.

The above-mentioned semiconductor integrated circuit 100 can be used as an output circuit in a semiconductor device. For example, the semiconductor integrated circuit 100 according to the present embodiment can be used as an output circuit 100 for outputting data read from a storage device 6 (for example, DRAM) as shown in FIG. 9 to a processor 5. The storage device 6 shown in FIG. 9 includes a memory cell array 1, a sense amplifier 2, an address decoder 3 and the output circuit 100, and is connected to the processor 5 through the transmission line 4. Output data 10 selected from the memory cell array 1 by the address decoder 3 is outputted to the output circuit 100 through the sense amplifier 2. The output circuit 100 outputs the output data 10 to the processor 5 through a transmission line 4 (data bus) with current drive capability set as described above. At this time, as described above, the output impedance is matched to the impedance of the transmission line 4.

Since the power consumption of the output circuit 100 according to the present embodiment during when an operation toward the impedance matching is performed and when the impedance is matched (stable state) can be reduced. As a result, the power consumption of the semiconductor device (for example, DRAM) that mounts the output circuit 100 therein can be also reduced.

Although some embodiments of the present invention has been described in detail, the specific configuration thereof is not limited to the above-mentioned embodiments, and modifications that do not deviate from the subject matter of the present invention also fall within the scope of the present invention. The internal control clock CLK for controlling timing of the clock signals C0 to C4 may be generated by a clock generating circuit provided in the semiconductor integrated circuit 100 or may be inputted from the outside of the semiconductor integrated circuit 100. Although the counter control circuits P20, N20 each include a combination of the registers and the EXNOR circuit in the above-mentioned embodiment, it goes without saying that the other combinations such as any memory and processor may be adopted.

What is claimed is:

1. A semiconductor integrated circuit comprising:
   an output driver having an output coupled to a transmission line and whose current drive capability is changed correspondingly to an impedance adjustment code;
   a replica driver having an output coupled to a replica resistor whose resistance is set to be K (K is a natural number) times of an impedance of the transmission line, and whose current drive capability is changed correspondingly to the impedance adjustment code;
   a comparator configured to output a comparison result of an output voltage of the output of the replica driver and a reference voltage as a count data;
   a counter configured to generate the impedance adjustment code based on a counting operation corresponding to the count data; and
   a counter control circuit configured to sequentially input the count data as a plurality of count data and to suspend the counting operation of the counter for a predetermined period of time correspondingly to the plurality of count data.

2. The semiconductor integrated circuit according to claim 1, wherein the counter control circuit comprises:
   a latch circuit configured to sequentially hold the plurality of count data; and
   a comparison and determination circuit configured to perform a comparison between respective values of the plurality of count data held in the latch circuit, and to control the counting operation of the counter based on a result of the comparison, and
   the comparison and determination circuit is configured to suspend the counting operation of the counter when the plurality of count data held in the latch circuit include count data having different values.

3. The semiconductor integrated circuit according to claim 2, wherein the counter is configured to change the impedance adjustment code in synchronization with a clock signal inputted via the comparison and determination circuit, and
   the comparison and determination circuit is configured to output the clock signal to the counter when all of the plurality of count data held in the latch circuit coincide, and to block an input of the clock signal to the counter when count data having different values are included in the latch circuit.

4. The semiconductor integrated circuit according to claim 3, wherein the latch circuit includes a shift register configured to input a count data from the comparator in synchronization with an internal clock signal, and
   the comparison and determination circuit is configured to perform processing to determine a coincide of count data by reading a plurality of count data stored in the shift register at a predetermined timing.

5. The semiconductor integrated circuit according to claim 3, wherein the clock signal is inputted to the comparison and determination circuit in synchronization with an internal clock signal.

6. The semiconductor integrated circuit according to claim 4, further comprising:
   an internal clock generation circuit configured to generate the internal clock signal.

7. The semiconductor integrated circuit according to claim 1, wherein the output driver comprises: an n number of first transistors whose respective sources and drains are parallelly connected between a first power source and an output terminal; and an n number of second transistors whose respective sources and drains are connected between a second power source and the output terminal, and electrical connections between the respective sources and drains of the n number of first transistors and the n number of second transistors are controlled in accordance with the impedance adjustment code being an n bits and inputted to respective gates of the first and second transistors.

8. The semiconductor integrated circuit according to claim 7, wherein the replica driver comprises an n number of third transistors whose respective sources and drains are connected between the first power source and the replica resistor, and electrical connections between the respective sources and drains of the n number of third transistors are controlled in accordance with the impedance adjustment code being an n bit and inputted to respective gates of the third transistors.

9. The semiconductor integrated circuit according to claim 1, further comprising:

a memory cell array, wherein data read from the memory cell array is outputted to a data bus via the output driver.

10. A semiconductor integrated circuit configured to be coupled to a replica resistor, an output impedance of the semiconductor integrated circuit is autonomously adjusted based on the replica resistor, the semiconductor integrated circuit comprising:

an output driver having an output configured to be coupled to a transmission line;

a replica driver having an output configured to be coupled to the replica resistor, each of the output driver and the replica driver having a current drive capability to be changed corresponding to an impedance adjustment code;

a comparator coupled to the replica resistor to compare a terminal voltage of the replica resistor with a reference voltage and to output a comparison result thereof;

a counter generating the impedance adjustment code based on a counting operation of the comparison result; and a counter control circuit coupled between the comparator and the counter to store a predetermined number of latest comparison results of the comparator and to suspend the counting operation based on the stored comparison results.

11. The semiconductor integrated circuit according to claim 10, wherein the counter control circuit suspends the counting operation of the counter when all of the stored comparison results is a same value.

12. The semiconductor integrated circuit according to claim 10, wherein the counter control circuit does not suspend the counting operation when all of the stored comparison results is a same value.

13. A semiconductor integrated circuit coupled to a configured to be replica resistor, an output impedance of the semiconductor integrated circuit is autonomously adjusted based on the replica resistor, the semiconductor integrated circuit comprising:

an output driver having an output configured to be coupled to a transmission line;

a replica driver having an output configured to be coupled to the replica resistor, each of the output driver and the replica driver having a current drive capability to be changed corresponding to an impedance adjustment code; and a counter configured to generate the impedance adjustment code based on a terminal voltage of the replica resistor, wherein the counter suspends generating the impedance adjustment code for a predetermined period of time after the terminal voltage is adjusted to be a stable state.

14. The semiconductor integrated circuit according to claim 13, further comprising:

a comparator coupled to the replica resistor to compare a terminal voltage of the replica resistor with a reference voltage and to output a comparison result thereof; and a counter control circuit coupled between the comparator and the counter to store a predetermined number of latest comparison results of the comparator and to suspend the counting operation based on the stored comparison results, wherein the predetermined period of time is determined in response to the predetermined number.

\* \* \* \* \*

UNITED STATES PATENT AND TRADEMARK OFFICE
CERTIFICATE OF CORRECTION

| | | |
|---|---|---|
| PATENT NO. | : 8,111,085 B2 | Page 1 of 1 |
| APPLICATION NO. | : 12/846333 | |
| DATED | : February 7, 2012 | |
| INVENTOR(S) | : Takayuki Ibaraki et al. | |

It is certified that error appears in the above-identified patent and that said Letters Patent is hereby corrected as shown below:

In the Claims

Column 22, Line 12: In Claim 13, delete "coupled to a configured to be" and insert -- configured to be coupled to a --

Signed and Sealed this
Sixth Day of May, 2014

Michelle K. Lee
*Deputy Director of the United States Patent and Trademark Office*